(12) United States Patent
Kulkarni et al.

(10) Patent No.: US 7,462,551 B2
(45) Date of Patent: Dec. 9, 2008

(54) ADHESIVE SYSTEM FOR SUPPORTING THIN SILICON WAFER

(75) Inventors: Sudhakar N. Kulkarni, Chandler, AZ (US); Leonel R. Arana, Phoeniz, AZ (US); Edward R. Prack, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 373 days.

(21) Appl. No.: 11/241,499

(22) Filed: Sep. 30, 2005

(65) Prior Publication Data

US 2007/0077728 A1    Apr. 5, 2007

(51) Int. Cl.
*H01L 21/30* (2006.01)
*H01L 21/46* (2006.01)

(52) U.S. Cl. .............................. 438/455; 257/E21.567; 438/458

(58) Field of Classification Search .................. 438/455, 438/458; 257/E21.567
See application file for complete search history.

(56) References Cited

U.S. PATENT DOCUMENTS 6,245,593 B1 *  6/2001  Yoshihara et al. ........... 438/106
6,982,184 B2 *  1/2006  Silverbrook ................. 438/51

OTHER PUBLICATIONS

U.S. Appl. No. 11/173,857, filed Jun. 30, 2005 Inventor: Leonel R. Arana et al Entitled: Method of Supporting Microelectric Wafer During Backside Processing using Carrier Having Radiation Absorbing Film Thereon.

* cited by examiner

*Primary Examiner*—Asok K Sarkar
(74) *Attorney, Agent, or Firm*—David L. Guglielmi

(57) ABSTRACT

In some embodiments, an adhesive system for supporting thin silicon wafer is presented. In this regard, a method is introduced to bond a silicon wafer to a translucent carrier through the use of an adhesive. Other embodiments are also disclosed and claimed.

5 Claims, 2 Drawing Sheets

ADHESIVE SYSTEM FOR SUPPORTING THIN SILICON WAFER

FIELD OF THE INVENTION

Embodiments of the present invention generally relate to the field of processing silicon wafers, and, more particularly to an adhesive system for supporting thin silicon wafer.

BACKGROUND OF THE INVENTION

In the process of fabricating a microelectronic wafer (hereinafter "wafer"), backside processing is performed generally after a wiring pattern is provided on the front surface of the wafer. Backside processing may include mechanical or chemical methods for thinning the wafer, such as, for example, grinding, chemical-mechanical polishing, and etching. Backside processing may further include processes other than thinning, such as, for example, thin film deposition and/or electroplating. However, backside processing tends to negatively affect the strength and rigidity of the wafer, thus increasing the likelihood that the wafer may be damaged through breakage or warping, especially where the wafer has a thickness below about 300 microns. In order to move and process a silicon wafer, it is typically attached to a more rigid carrier which provides mechanical support. The process of subsequently separating the silicon wafer from the carrier can be quite time consuming and inefficient.

BRIEF DESCRIPTION OF THE DRAWINGS

The present invention is illustrated by way of example and not limitation in the figures of the accompanying drawings in which like references indicate similar elements, and in which.

DETAILED DESCRIPTION

In the following description, for purposes of explanation, numerous specific details are set forth in order to provide a thorough understanding of the invention. It will be apparent, however, to one skilled in the art that embodiments of the invention can be practiced without these specific details. In other instances, structures and devices are shown in block diagram form in order to avoid obscuring the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1A:
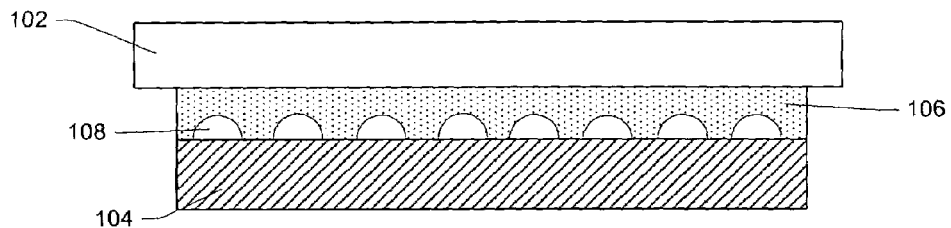
FIGS. 1A-1C are cross-sectional views of an example adhesive system, in accordance with one example embodiment of the invention.
Figure 1B:
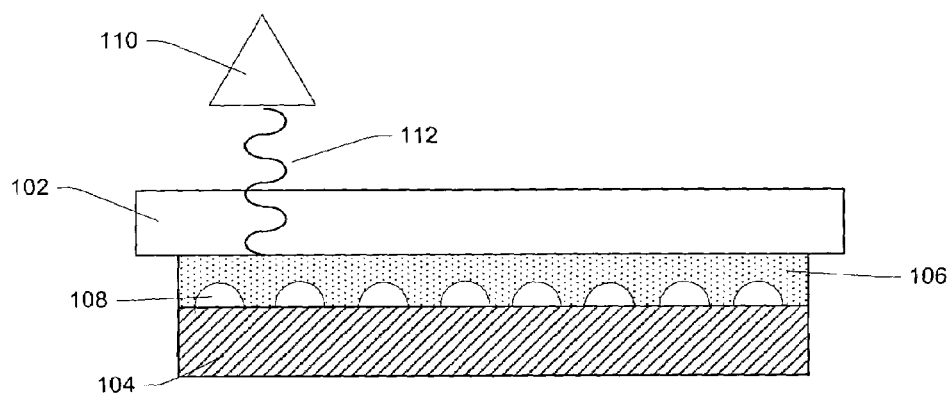
Figure 1C:
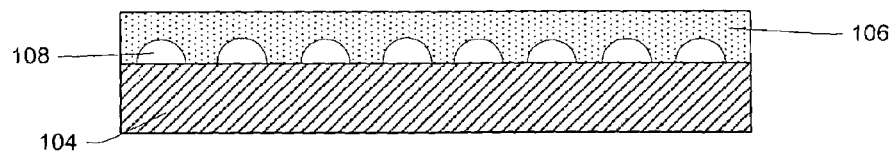

FIGS. 1A-1C are cross-sectional views of an example adhesive system, in accordance with one example embodiment of the invention. In accordance with the illustrated example embodiment, adhesive system 100 may include carrier 102, silicon wafer 104, adhesive 106, and bumps 108 as shown in FIG. 1A.

Carrier 102 provides mechanical support for silicon wafer 104 during handling and processing and is translucent so as to allow radiation, for example laser or ultraviolet radiation, to pass through it. Carrier 102 may be made of glass, plastic, an acrylic-based material, or any other translucent material.

Silicon wafer 104 may be a raw silicon wafer or may have been processed to some extent. In one embodiment, silicon wafer 104 is to be processed into a plurality of integrated circuit chips. The backside of silicon wafer 104 may be processed through backgrinding, photolithography, wet etching, dry etching or electroplating.

Adhesive 106 bonds silicon wafer 104 to carrier 102. Adhesive 106 may have been applied first to carrier 102 or to silicon wafer 104. In one embodiment, adhesive 106 softens or weakens when exposed to ultraviolet or laser radiation, for example radiation with a wavelength of about 355 nm, thereby allowing silicon wafer 104 to be separated from carrier 102. In one embodiment adhesive 106 is spun on, while in another embodiment adhesive 106 is laminated on to either silicon wafer 104 and/or carrier 102. Adhesive 106 may setup quickly or may need to be cured to harden.

Bumps 108 may represent a conductive material, for example solder, that has been affixed to the top of silicon wafer 104. In another embodiment bumps 108 are not present, and in yet another embodiment there are springs or bond pads instead of bumps.

FIG. 1B depicts an example method of separating carrier 102 from silicon wafer 104 after processing of silicon wafer 104. In one embodiment, radiation source 110 is directed at carrier 102 and radiation 112, which is emitted from radiation source 110, passes through carrier 102 striking adhesive 106. In one embodiment radiation source 110 is a laser. In another embodiment radiation source 110 is a radiation lamp. In one embodiment, radiation 112 has a wavelength of about 355 nm. Adhesive 106 may soften or decompose after absorbing the radiation, and carrier 202 may be easily removed.

FIG. 1C depicts silicon wafer 104 after being separated from carrier 102. Remaining adhesive 106 can subsequently be removed by thermal decomposition, peeling, plasma cleaning, pellet cleaning, or chemical stripping.

Figure 2A:
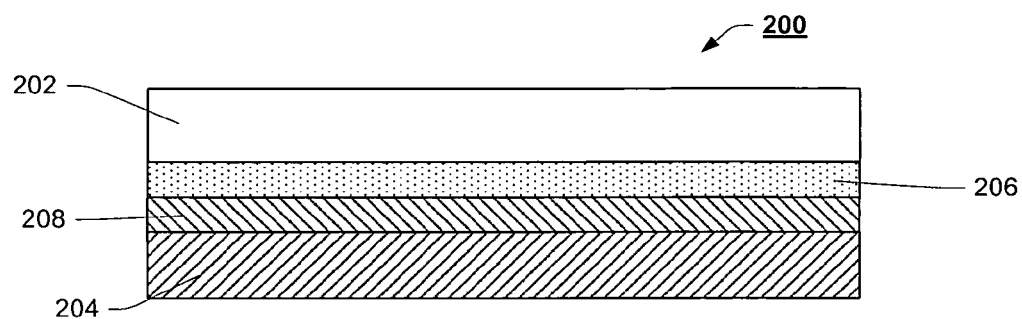
FIGS. 2A-2C are cross-sectional views of another example adhesive system, in accordance with one example embodiment of the invention.
Figure 2B:
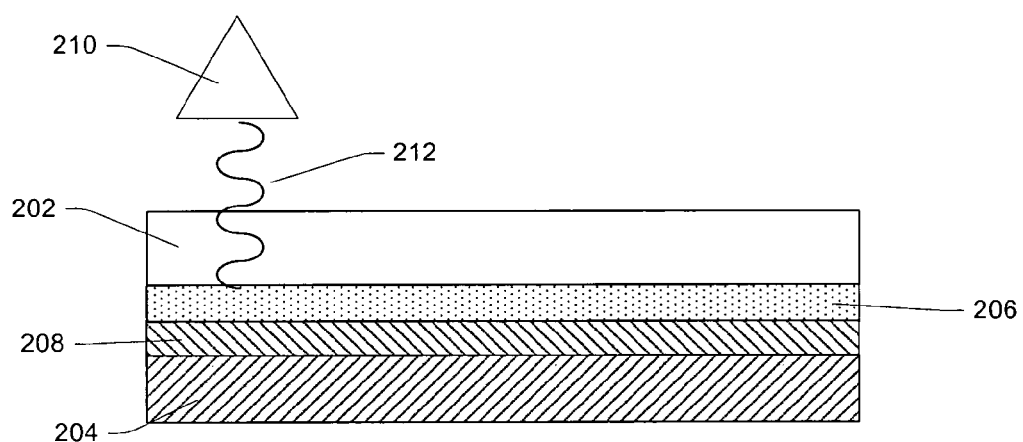
Figure 2C:
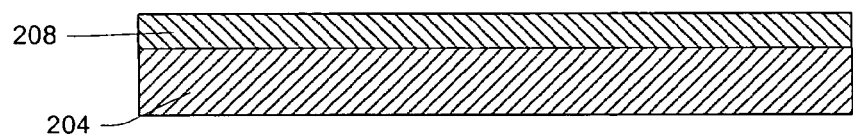

FIGS. 2A-2C are cross-sectional views of another example adhesive system, in accordance with one example embodiment of the invention. In accordance with the illustrated example embodiment, adhesive system 200 may include carrier 202, silicon wafer 204, first adhesive 206, and second adhesive 208 as shown in FIG. 2A Carrier 202 provides mechanical support for silicon wafer 204 during handling and processing and is translucent so as to allow radiation, for example laser or ultraviolet radiation, to pass through it. Carrier 202 may be made of glass, plastic, an acrylic-based material, or any other translucent material.

Silicon wafer 204 may be a raw silicon wafer or may have been processed to some extent. In one embodiment, silicon wafer 204 is to be processed into a plurality of integrated circuit chips. The backside of silicon wafer 204 may be processed through backgrinding, photolithography, wet etching, dry etching or electroplating.

First adhesive 206 bonds carrier 202 with second adhesive 208. First adhesive 206 may absorb radiation with a wavelength of about 355 nm causing first adhesive 206 to lose adhesion strength. First adhesive 206 may be spun on or laminated to carrier 202 and/or second adhesive 208. In one embodiment, first adhesive 206 is less than about 10 micrometers thick. In one embodiment, first adhesive 206 is a polynorbornene polymer such as Promerus Unity 4698.

Second adhesive 208 bonds silicon wafer 204 with first adhesive 206. In one embodiment second adhesive 208 has a higher modulus than first adhesive 206, providing stronger support for silicon wafer 204. Second adhesive 208 may be spun on or laminated to silicon wafer 204 and/or first adhesive 206. In one embodiment, second adhesive 208 may be easily stripped mechanically or chemically. In one embodiment, second adhesive 208 is greater than about 10 micrometers thick.

FIG. 2B depicts an example method of separating carrier 202 from silicon wafer 204 after processing of silicon wafer 204. In one embodiment, radiation source 210 is directed at carrier 202 and radiation 212, which is emitted from radiation source 210, passes through carrier 202 striking first adhesive 206. In one embodiment radiation source 210 is a laser. In another embodiment radiation source 210 is a radiation lamp. In one embodiment, radiation 212 has a wavelength of about 355 nm. First adhesive 206 may soften or decompose after absorbing the radiation, and carrier 202 may be easily removed.

FIG. 2C depicts silicon wafer 204 after being separated from carrier 202. Second adhesive 208 can subsequently be removed by thermal decomposition, peeling, plasma cleaning, pellet cleaning, or chemical stripping.

Many of the methods are described in their most basic form but operations can be added to or deleted from any of the methods and information can be added or subtracted from any of the described messages without departing from the basic scope of the present invention. Any number of variations of the inventive concept is anticipated within the scope and spirit of the present invention. In this regard, the particular illustrated example embodiments are not provided to limit the invention but merely to illustrate it. Thus, the scope of the present invention is not to be determined by the specific examples provided above but only by the plain language of the following claims.

What is claimed is:

1. A method comprising:
   applying a first adhesive to a surface of a silicon wafer;
   applying a second adhesive to a surface of a glass carrier, the second adhesive being able to absorb radiation with a wavelength of about 355 nm and the second adhesive being less strong than the first adhesive; and
   bonding the first adhesive to the second adhesive.

2. The method of claim 1, further comprising:
   performing backside processing on the silicon wafer; and
   applying radiation to the adhesive through the translucent carrier so as to weaken the adhesive and enable separation of the translucent carrier from the silicon wafer.

3. The method of claim 2, wherein applying radiation comprises:
   directing energy from a device chosen from the group consisting of a laser and a lamp.

4. The method of claim 2, wherein performing backside processing on the silicon wafer comprises:
   performing at least one procedure chosen from the group consisting of backgrinding, photolithography, wet etching, dry etching and electroplating.

5. The method of claim 2, further comprising removing any remaining adhesive from the silicon wafer by a method chosen from the group consisting of thermal decomposition, peeling, plasma cleaning, pellet cleaning, and chemical stripping.

* * * * *